United States Patent
Ikeda et al.

(10) Patent No.: US 7,564,494 B2
(45) Date of Patent: *Jul. 21, 2009

(54) SOLID-STATE IMAGING DEVICE AND ITS DRIVING METHOD FOR PREVENTING DAMAGE IN DYNAMIC RANGE

(75) Inventors: Katsumi Ikeda, Miyagi (JP); Yuko Nomura, Miyagi (JP); Makoto Kobayashi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 708 days.

This patent is subject to a terminal disclaimer.

(21) Appl. No.: 11/202,066

(22) Filed: Aug. 12, 2005

(65) Prior Publication Data

US 2006/0033830 A1    Feb. 16, 2006

(30) Foreign Application Priority Data

Aug. 13, 2004    (JP)    ............................. 2004-235860

(51) Int. Cl.
   *H04N 5/335* (2006.01)
(52) U.S. Cl. .................. 348/311; 349/302; 349/272; 349/281; 349/282; 349/294
(58) Field of Classification Search ................ 348/302, 348/272, 281, 282, 294, 311
See application file for complete search history.

(56) References Cited

U.S. PATENT DOCUMENTS 6,774,350 B2 *   8/2004   Okada ..................... 250/208.1
7,352,454 B2 *   4/2008   Bamji et al. .............. 356/141.1
2001/0055832 A1* 12/2001  Schmitz et al. ............... 438/57
2002/0047139 A1  4/2002   Wako et al.
2003/0025816 A1*  2/2003  Sakuragi ..................... 348/301
2004/0109075 A1*  6/2004  Tsunai ........................ 348/311

FOREIGN PATENT DOCUMENTS

JP    10-136391 A    5/1998
JP    2002-134732 A  5/2002

* cited by examiner

*Primary Examiner*—Tuan V Ho
*Assistant Examiner*—Quang V Le
(74) *Attorney, Agent, or Firm*—Birch, Stewart, Kolasch & Birch, LLP

(57)    ABSTRACT

A solid-state imaging apparatus comprises a semiconductor substrate, a multiplicity of photo electric conversion elements, a vertical electric charge transfer device having a plurality of vertical electric charge transfer channels and transfer electrodes, reading out parts and a driving device that imposes a first voltage to the reading out electrode for reading out the accumulated signal electric charge from the photo electric conversion elements to the transfer channels in a reading out period and at a same time during the reading out period imposes a second voltage to at least one of the transfer electrodes adjoining to the reading out electrode for each photo electric conversion element for accumulating the signal electric charge in the vertical electric charge transfer channel under the one of the transfer electrode. Damage in the dynamic range of the solid-state imaging apparatus can be prevented.

8 Claims, 5 Drawing Sheets

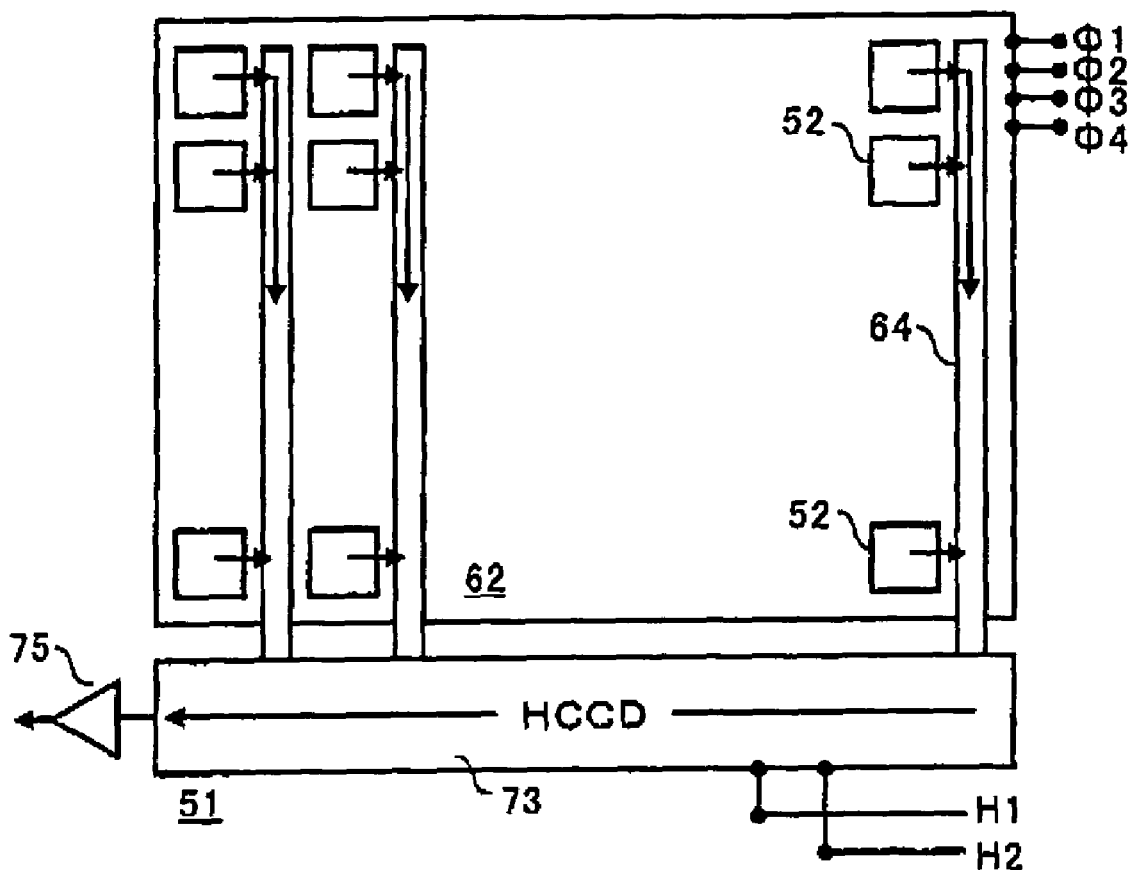

SOLID-STATE IMAGING DEVICE AND ITS DRIVING METHOD FOR PREVENTING DAMAGE IN DYNAMIC RANGE

CROSS REFERENCE TO RELATED APPLICATION

This application is based on Japanese Patent Application 2004-235860, filed on Aug. 13, 2004, the entire contents of which are incorporated herein by reference.

BACKGROUND OF THE INVENTION

A) Field of the Invention

This invention relates to a solid-state imaging apparatus and its driving method, and more in detail, relates to a solid-state imaging apparatus and a driving method of the solid-state imaging apparatus for preventing damage in a dynamic range of the solid-state imaging device.

B) Description of the Related Art

FIG. 6 is a schematic plan view showing a conventional solid-state imaging apparatus 51.

The solid-state imaging apparatus 51 is an inter-line type CCD (ITCCD) that is the most widely used as the conventional solid-state imaging apparatus. A large number of photoelectric conversion elements (pixels) 52 are arranged in a tetragonal matrix in a light receiving region 62. In each interval of the rows of the photoelectric conversion elements 52, a vertical signal charge transfer circuit (VCCD) 64 that read the signal charge generated by the photoelectric conversion elements 52 to transfer in vertical direction are formed including a transfer electrode and a vertical transfer channel, and the signal electric charge generated by the photoelectric conversion elements 52 is transferred in vertical direction.

In the drawing, a horizontal electric charge transfer circuit (HCCD) 73 that transfers the electric charge transferred by the VCCD 64 to a peripheral circuit 75 by one line is formed.

FIG. 7A is an enlarged plan view showing a part of the light receiving region 52 of the conventional solid-state imaging apparatus 51. FIG. 7B is an enlarged cross sectional view of a broken line A to B in FIG. 7A. FIG. 7C is an enlarged cross sectional view of a broken line C to D.

Each of the vertical transfer channel 54 is formed corresponding to each row of the photoelectric conversion elements 52, and transfers the signal electric charges read out via a reading-out gate channel region 51c formed adjoining to each photoelectric conversion element 52 to the vertical direction. A channel stop region 53 is positioned adjoining to the vertical transfer channel 54 on the opposite side of the reading-out gate channel region 51c. Moreover, the transfer electrodes 56 (the first layer poly-silicon electrode 56a and the second layer poly-silicon 56b) are formed over the vertical transfer channel 54 via the insulating film 60a.

During a reading-out period, the signal charges generated by the photoelectric conversion elements (pixel) 52 are read out to the vertical transfer channels 54 by imposing a high level voltage (VH) to the second layer poly-silicon electrode 56b (φV1) equipped on the reading-out gate channel region (reading-out part) 51c.

Thereafter, during a transfer period, the signal charges are transferred to the HCCD 73 by sequentially imposing a mid-level pulse (VM) or a low-level pulse (VL) to the transfer electrodes 56a to 56d. A horizontal transfer of the electric charges by the HCCD 73 is executed by the two-phase drive with HM/HL pulses during a period between the transfer operations of the VCCD 64 in the transfer period.

FIG. 8A shows electric potentials between a broken line E-F in FIG. 7B. An overflow drain that discharges an excessive signal electric charge of the photoelectric conversion elements 52 is formed by adding an inverse bias on an n-type substrate 51a to form an appropriate electric potential barrier between the photoelectric conversion element 52 and the n-type substrate 51a.

In the drawing, the electric potential indicated with a solid line is in a condition that the electric charges are accumulated in the photoelectric conversion element 52. Since a low voltage (VM or VL) is imposed on the electrode 56b, a reading part 51c is closed, and the accumulated signal charges are not read out to the vertical transfer channel 54.

In the drawing, the electric potential indicated with a dashed line is in a condition that a high voltage (VH) is imposed on the electrode 56b, and the electric potential barrier to the vertical transfer channel 54 from the photoelectric conversion elements 52 is eliminated by imposing a sufficient high voltage, and all the electric charges will move to the vertical transfer channel 54.

This is that the photoelectric conversion element 52 is in a fully-depleted condition. If the full-depletion is not executed at a time of reading out, for example, the electric charge left in the photoelectric conversion element 52 is added to the signal electric charge stored until the reading-out time in a case that the reading-out operation and the transfer operation are continuously repeated as movie motion, and a remarkable picture degradation of movie picture is caused as an after image phenomenon. Therefore, it is necessary that sufficient voltage is imposed for the full-depletion of the photoelectric conversion element 52 at a time of reading-out. Hereinafter, the minimum necessary voltage for the full-depletion is called the minimum full-depletion voltage.

FIG. 8 shows the electric potential between a broken line G-H in FIG. 7C. In the drawing, a solid line shows a state that a low voltage (VM or VL) is imposed on the electrode 56b, and a broken line shows a state that the high voltage (VH) is imposed on the electrode 56b.

Since the electric potential of the reading-out part 51c is low in the adjusting electrode 56a and the channel stop region 53, a potential slope is generated by a fringe electric field. For example, as shown in the drawing, the electric potential in a lower part of the electrode 56b will be an electric potential distribution with an acute angle, and it will be a low electric potential as compared to the case that a width of the electrode is sufficiently wide. This is so-called a narrow channel, and it is necessary to impose higher voltage for obtaining desired electric potential. That is, it causes the minimum full-depletion voltage.

Moreover, since it is desired that a film thickness of an insulating film 60a is made thin for increasing transfer capacity per unit area of the VCCD 64 in miniaturization of the element, it is necessary that the minimum full-depletion is controlled to be low. Moreover, when the high voltage is necessary, increase in the consumption of electricity will be caused.

SUMMARY OF THE INVENTION

It is an object of the present invention to provide a solid-state imaging apparatus that can reduce increase in the minimum fill-depletion voltage that increases corresponding to miniaturization of the element.

According to one aspect of the present invention, there is provided a solid-state imaging apparatus, comprising: a semiconductor substrate defining a two-dimensional surface; a multiplicity of photo electric conversion elements arranged in a plurality of rows and in a plurality of lines in a light receiving region of the semiconductor substrate; a vertical electric charge transfer device having a plurality of vertical electric charge transfer channels arranged vertically between rows of the photo electric conversion elements and a plurality of transfer electrodes horizontally arranged over the vertical electric charge transfer channels; reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction; and a driving device that imposes a first voltage to the reading out electrode for reading out the accumulated signal electric charge from the photo electric conversion elements to the transfer channels in a reading out period and at a same time during the reading out period imposes a second voltage to at least one of the transfer electrodes adjoining to the reading out electrode for each photo electric conversion element for accumulating the signal electric charge in the vertical electric charge transfer channel under the one of the transfer electrode.

According to the present invention, a solid-state imaging apparatus that can reduce increase in the minimum fill-depletion voltage that increases corresponding to miniaturization of the element can be provided.

BRIEF DESCRIPTION OF THE DRAWINGS

FIG. 6 is a schematic view showing a conventional solid-state imaging apparatus 51.

DETAILED DESCRIPTION OF THE PREFERRED EMBODIMENTS

Figure 1:
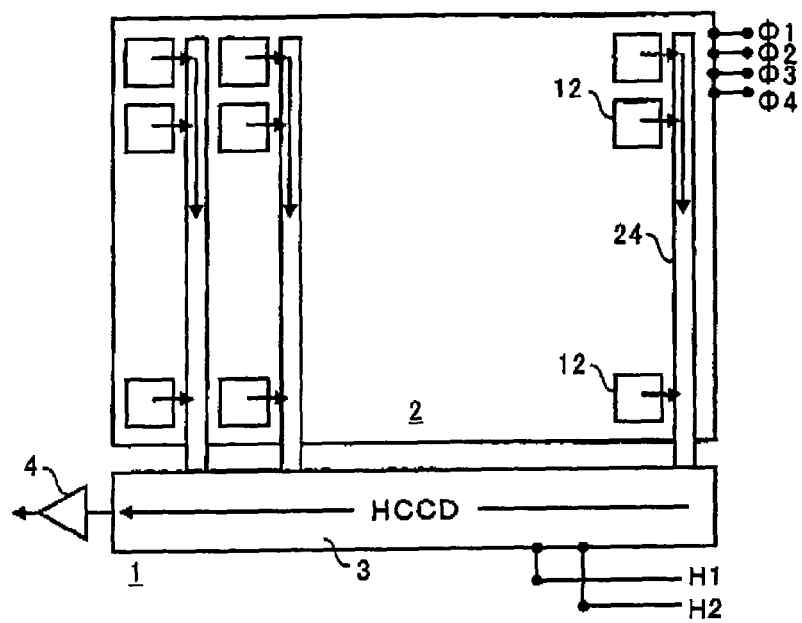
FIG. 1 is a block diagram showing a structure of a CCD-type solid-state imaging apparatus according to an embodiment of the present invention.

FIG. 1 is a block diagram showing a structure of a CCD-type solid-state imaging apparatus according to an embodiment of the present invention.

The solid-state imaging apparatus 1 includes a light receiving region 2 in which a large number of photoelectric conversion elements 12 is arranged. The large number of the photoelectric conversion elements 12 are arranged in a tetragonal matrix in the light receiving region 2. In each space between rows of the photoelectric conversion elements 12, a vertical electric charge transfer device (VCCD) 24 that reads the signal electric charge generated by the photoelectric conversion elements 12 is formed including the transfer electrodes 16a and 16b, and the vertical transfer channel 14 in FIG. 2. Then, the signal electric charge generated by the photoelectric conversion elements 12 is transferred in the vertical direction with a four phased driving pulse ($\phi 1$ to $\phi 4$).

In the drawing, a horizontal electric charge transfer device (HCCD) 3 that transfers the signal charge transferred by the VCCD to the peripheral circuit by every two lines is formed under the light receiving region.

Moreover, a peripheral circuit 4 consisted of, for example, a metal oxide semiconductor (MOS) transistor circuit or the like, is formed outside the light receiving region 2. For example, a floating diffusion amplifier (FDA) and the like is included as the peripheral circuit 4.

Figure 2:
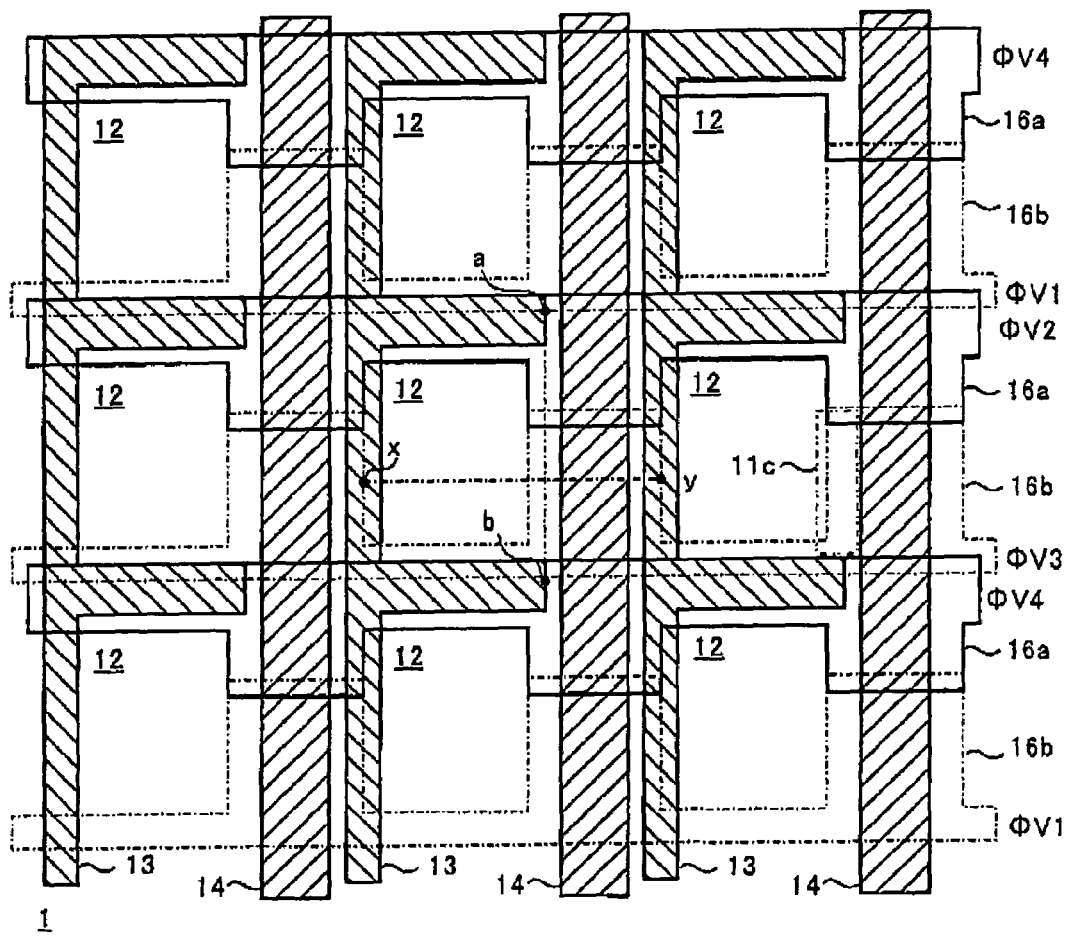
FIG. 2 is an enlarged plan view showing a part os a light receiving region 2 of the solid-state imaging apparatus 1.

FIG. 2 is an enlarged plan view showing a part of the light-receiving region 2 of the solid-state imaging apparatus 1, and shows a condition wherein the insulating film on the semiconductor substrate is peeled to expose the photoelectric conversion elements 12 and the transfer electrodes 16.

Figure 3A:
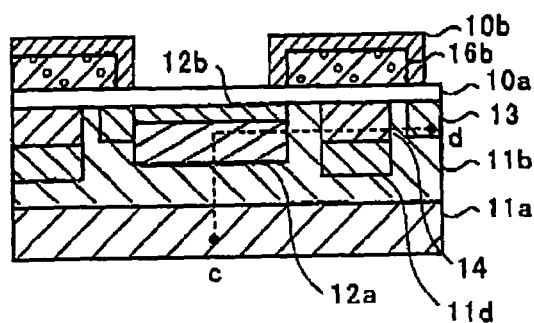
FIG. 3 is an enlarged cross sectional view of the solid-state imaging apparatus 1.
Figure 3B:
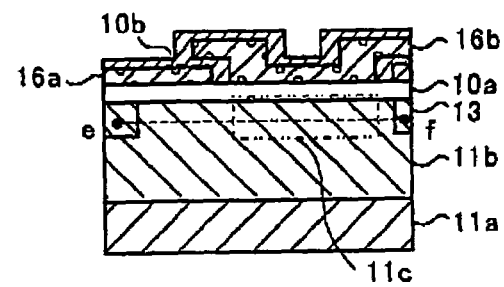

FIG. 3 is an enlarged cross sectional view of the solid-state imaging apparatus 1. Moreover, FIG. 3A shows the solid-state imaging apparatus cut across a single short-dashed line x-y in FIG. 2, and FIG. 3B shows the solid-state imaging apparatus cut across a single short-dashed line a-b in FIG. 2

In the below-described explanation, in order to distinguish the degrees of impurity concentrations between impurity added regions having the same conductive type, it is transcribed as a $p^-$-type impurity added region, a p-type impurity added region and a $p^+$-type impurity added region, or an $n^-$-type impurity added region, an n-type impurity added region and an $n^+$-type impurity added region in sequence from the region that has relatively low in the impurity concentration. Except for a case that the $p^-$-type impurity added region 11b is formed by the epitaxial growing method, it is preferable that all the impurity added regions are formed by ion-implantation and a thermal treatment after that.

The semiconductor substrate 11 has, for example, an $n^-$-type silicon substrate 11a and the $p^-$-type impurity added region 11b formed in a surface of the substrate 11. The $p^-$-type impurity added region 11b is formed by the thermal treatment after the ion-implantation of p-type impurity on one surface of the $n^-$-type silicon substrate 11a, or performing the epitaxial growth of silicon containing p-type impurity on one surface of the n-type silicon substrate 11a.

Next, an n-type impurity added region (vertical transfer channels) 14 are formed in the $p^-$type impurity added region 11b having a width of, for example, 0.5 µm corresponding to one row of the photoelectric conversion elements 12 formed in the later process. Each of the vertical transfer channels 14 has flat impurity concentration in a longitudinal (vertical) direction, and extends along with the corresponding row of the photoelectric conversion elements 12.

Moreover, in a case that the inverse bias is imposed on the $n^-$type silicon substrate 1, a $p^+$-type impurity added region 51d is formed under the n-type impurity added region (vertical transfer channel) 14 for preventing turning-off with the n-type impurity added region 14.

Next, a channel stop region 13 is formed adjoining to the vertical transfer channel 14 (on an opposite side of a reading gate channel region 11c). The channel stop region 13 is formed of, for example, $p^+$-type impurity added region, trench isolation or local oxidation (LOCOS).

A part of the p-type impurity added region 11c is remained along with the right side of each photoelectric conversion element 12 (n-type impurity added region 12a) formed in the later process. Each p-type impurity added region 11c is used as a channel region 11c for the reading gate.

Next, an oxide film (or an ONO film) 10 is formed on the surface of the semiconductor substrate 11. The ONO film is composed by a lamination layer formed by laminating, for example, a silicon oxide film (thermal oxidation film) with thickness of about 20 to 70 nm, a silicon nitride film with thickness of about 30 to 80 nm and a silicon oxide film with thickness of about 10 to 50 nm in this order. In FIG. 2, the oxide film 10 is represented with one layer for convenience of the explanation. Moreover, the above described oxide film 10 can also be formed with single oxide film ($SiO_2$).

Next, an electrode forming process is executed. In this process, a transfer electrodes (multilayered poly-silicon electrodes) 16a and 16b are formed on the oxide film 10. The first polycrystalline Si layer 16a is laminated with thickness of 0.2 μm to 3 μm (for example, 1 μm) on the oxide film 10 formed on the surface of the semiconductor substrate 1, and a photoresist film is applied on a surface of the first polycrystalline Si layer 16a. Then, after patterning the photo-resist film to a predetermined pattern by photolithography (exposure and development), by using the patterned photo-resist film as a mask, the first polycrystalline layer 16a in an unmasked region (a region without the mask) is etched off by dry-etching (using chlorine-type gas) with strong anisotropy (high velocity of etching in vertical direction to the mask). By that, the first poly-silicon electrode 16a is formed.

Next, the Si surface is oxidized, and a $SiO_2$ film (the second oxide film) is formed on the first poly-silicon electrode 16a with thickness of 300 Å to 1000 Å. Moreover, the second polycrystalline Si layer 16b is laminated on the second oxide film with thickness of 0.2μ to 3 μm (for example, 1 μm) by using reducing CVD method or the like. Then, the patterning of the second polycrystalline Si layer 16b is performed by using the photolithography, and the second layer poly-silicon electrode 16b is formed.

Next, predetermined points of the $p^-$-type impurity added region 11b are converted to the n-type impurity added region 12a by ion implantation. Moreover, the n-type impurity added region 12a functions as an electric charge accumulation region. By converting the surface layer part of the n-type impurity added region 12a to the $p^+$-type impurity added region 12b by ion implantation, a photoelectric conversion element 12 that is buried-type photo-diode is formed.

Next, an insulating film 10 is formed to cover the multi-layer poly-silicon electrodes 16 and a front surface of the silicon substrate 11, and a light shielding film (not shown in the drawing) is formed by laminating alloy consisted of two or more than two types of metals such as tungsten, aluminum, chrome, titan, molybdenum and the like by PVD or CVD. This light shielding film covers each transfer electrode 16 or the like and prevents unnecessary photoelectric conversion in a region other than the photoelectric conversion element 12. The light shielding film has one opening over each of the photoelectric conversion element 12. Moreover, a passivation layer, a planarizing insulating layer, a color filter layer, the second planarizing film and micro lenses are formed on the light shielding film.

A driving method of the solid-state imaging apparatus 1 according to the second embodiment of the present invention is explained in the below.

Figure 4A:
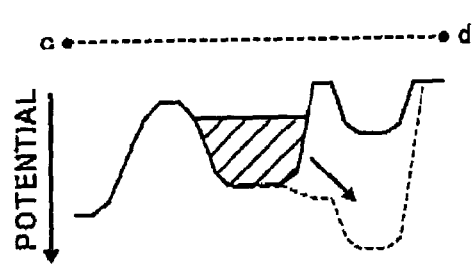
FIG. 4 is a graph showing electric potential between a broken line c-d in FIG. 3A and electric potential between a broken line e-f in FIG. 3B.

FIG. 4 shows electric potentials between a broken line c-d in FIG. 3A. An overflow drain that discharges an excessive signal electric charge of the photoelectric conversion elements 12 is formed by adding an inverse bias on an n-type substrate 51a to form an appropriate electric potential barrier between the photoelectric conversion element 12 and the n-type substrate 11a.

In the drawing, the electric potential indicated with a solid line is in a condition that the electric charges are accumulated in the photoelectric conversion element 12. Since a low voltage (VM or VL) is imposed on the electrode 16b, a reading part 11c is closed, and the accumulated signal charges are not read out to the vertical transfer channel 14.

In the diagram, the electric potential indicated with a broken line is a state that the signal charges generated by the photoelectric conversion elements (pixel) 12 are read out and that a high level voltage (VH) is imposed to the first layer poly-silicon electrode 56b (φV1) or 56a (φV2) equipped on the reading-out gate channel region (reading-out part) 51c during a reading-out period. The electric potential the electric potential barrier to the vertical transfer channel 14 from the photoelectric conversion elements 12 is eliminated by imposing a sufficient high voltage, and all the electric charges will move to the vertical transfer channel 14.

Thereafter, during a transfer period, the signal charges are transferred to the HCCD 3 by sequentially imposing a mid-level pulse (VM) or a low-level pulse (VL) to the transfer electrodes 16a to 16d. A horizontal transfer of the electric charges by the HCCD 3 is executed by the two-phase drive with HM/HL pulses during a period between the transfer operations of the VCCD 14 in the transfer period.

Figure 4B:
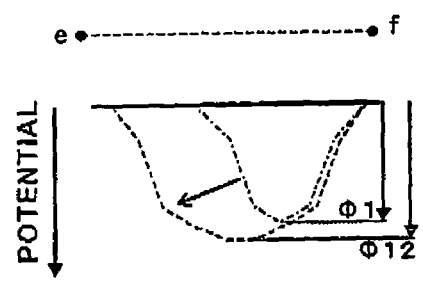

FIG. 4B shows the electric potential between a broken line e-f in FIG. 3B. In the diagram, a solid line shows a state that the low voltage (VL) is imposed on the electrodes 16a and 16b at the same time, and a broken line shows a state that the high voltage (VH) is imposed on the electrodes 16a and 16b. Moreover, in the embodiment of the present invention, the voltage imposed on the electrodes 16a and 16b is the same value; however, the voltage with the different value may be imposed on each electrode on each electrode. For example, the sufficiently high voltage that can read out the signal charge to the vertical transfer channel may be imposed on the electrode 16b, and the voltage that can at least accumulate the signal charge may be imposed on the electrode 16a. Moreover, the electric potential indicated with a single short-dashed line shows a state that the high voltage (VH) is imposed only on the electrode 16b.

By doing that, as compared to the reading part 51c by the conventional solid-state imaging apparatus 51 shown in FIG. 6, a width of the reading part 11c is substantially widened. Therefore, increase in the minimum fully-depleted voltage by a narrow-channel effect can be prevented.

Figure 5:
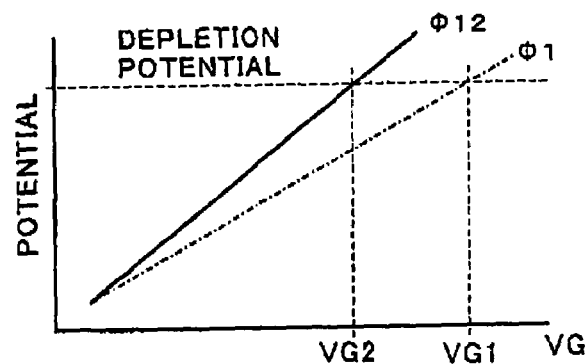
FIG. 5 is a graph showing $\phi 1$ and $\phi 12$ corresponding to voltage (VG) imposed on an electrodes 16a and 16b.
Figure 7A:
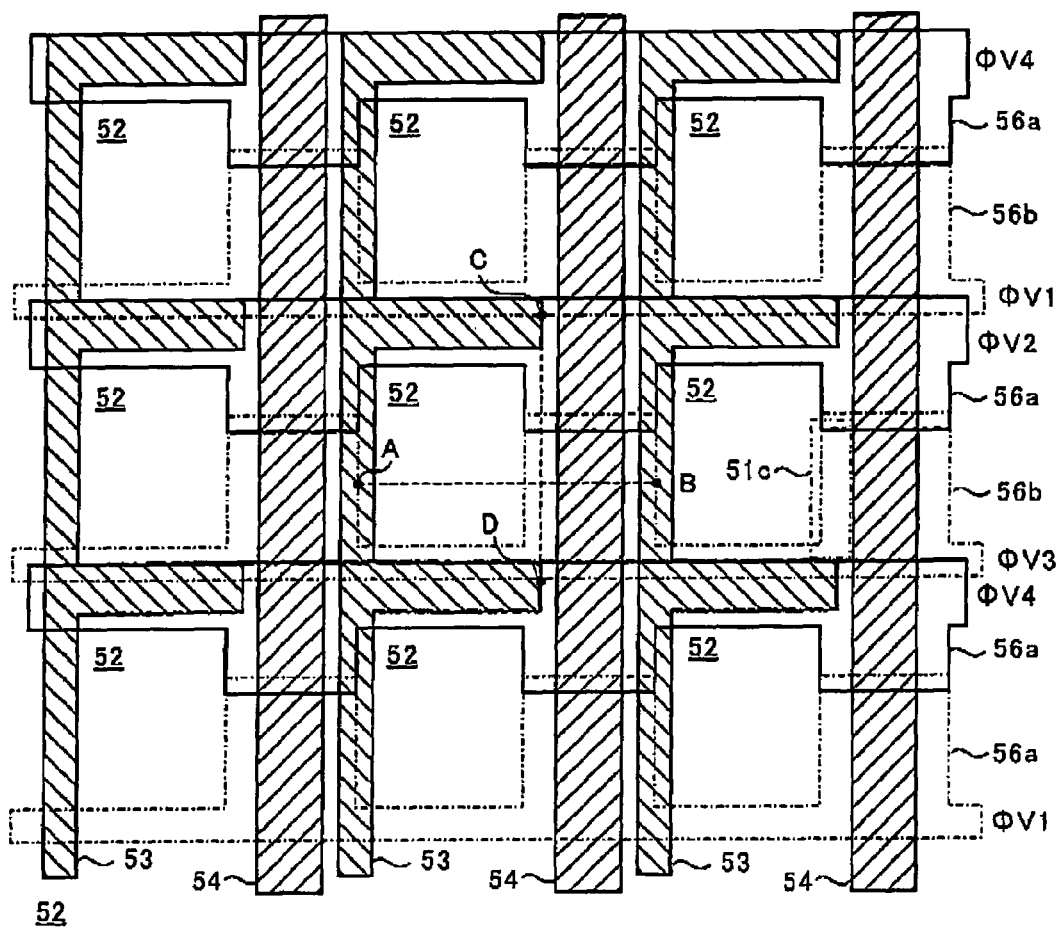
FIG. 7 are an enlarged plan view and an enlarged cross sectional view showing a part of the light receiving region 52 of the conventional solid-state imaging apparatus 51.
Figure 7B:
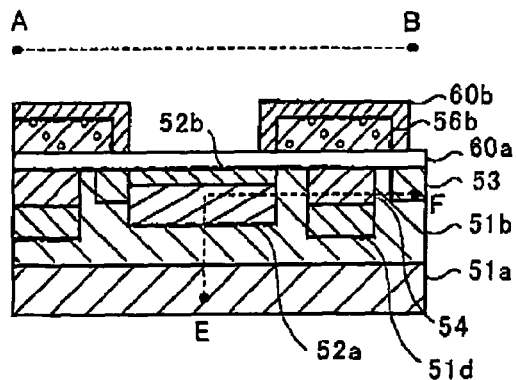
Figure 7C:
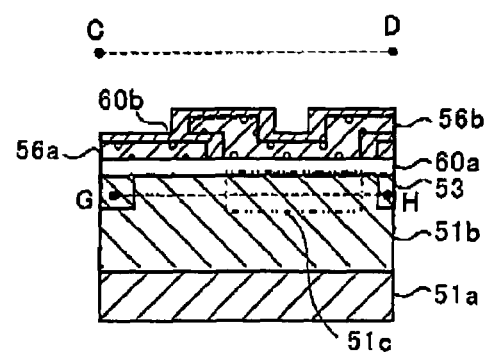
Figure 8A:
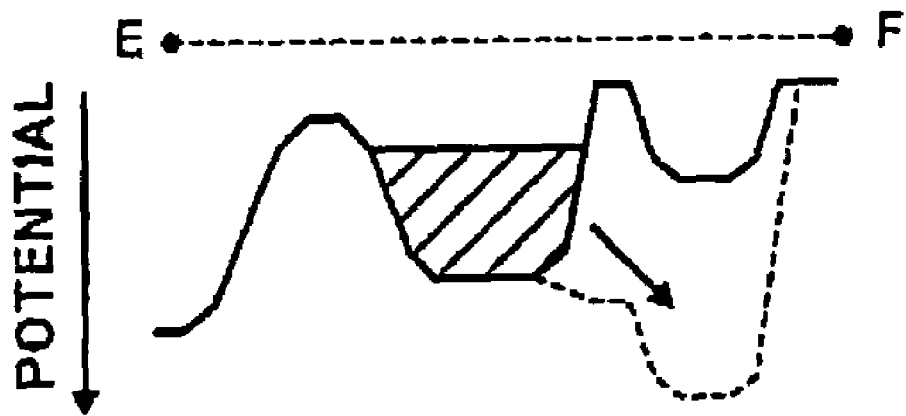
FIG. 8 is a graph showing electric potential between a broken line E-F in FIG. 7B.
Figure 8B:
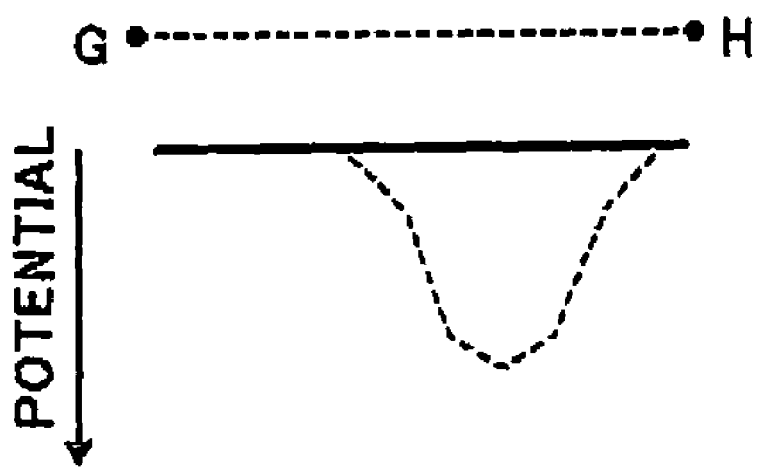

FIG. 5 is a graph showing φ1 and φ12 corresponding to voltage (VG) imposed on an electrodes 16a and 16b. VG1 indicates the voltage in a case that the high voltage is imposed only to the electrode 16b as the conventional solid-state imaging apparatus 51, and VG2 indicates the voltage that imposed to the each of the electrodes 16a and 16b in the solid-state imaging apparatus 1 according to the embodiment of the present invention. As obvious from the drawing, the minimum fully-depleted electric potential to achieve the fully-depleted electric potential of the photoelectric conversion element 12 will be VG2<VG1. Also, if the VG1 and the VG2 are the same voltage, that is, if the same voltage is imposed in the case that the voltage is imposed only to the electrode 16b, as in the case that the voltage is imposed to both of the electrodes 16a and 16b at the same time, a relationship between the electric potential φ1 and φ12 will be φ1<φ12.

Moreover, the above-described embodiment has been explained with the four-phase (φV1 to φV4) driving method; however, the same effect can be obtained by the well-known eight-phase driving method or the six-phase driving method.

The present invention has been described in connection with the preferred embodiments. The invention is not limited only to the above embodiments. It is apparent that various modifications, improvements, combinations, and the like can be made by those skilled in the art.

What are claimed are:

1. A solid-state imaging apparatus, comprising:
a semiconductor substrate defining a two-dimensional surface;
a multiplicity of photo electric conversion elements arranged in a plurality of rows and in a plurality of lines in a light receiving region of the semiconductor substrate;
a vertical electric charge transfer device having a plurality of vertical electric charge transfer channels arranged vertically between rows of the photo electric conversion elements and a plurality of transfer electrodes horizontally arranged over the vertical electric charge transfer channels;
reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction; and
a driving device that imposes a first voltage to the reading out electrode for reading out the accumulated signal electric charge from the photo electric conversion elements to the transfer channels in a reading out period and at a same time during the reading out period imposes a second voltage to at least one of the transfer electrodes adjoining to the reading out electrode for each photo electric conversion element for accumulating the signal electric charge in the vertical electric charge transfer channel under the one of the transfer electrode.

2. The solid-state imaging apparatus according to claim 1, wherein said reading out electrode on which the first voltage is imposed and said at least one of the transfer electrodes on which the second voltage is imposed are adjoining to same photo electric conversion element.

3. The solid-state imaging apparatus according to claim 1, wherein said first voltage and said second voltage are imposed at similar voltage.

4. The solid-state imaging apparatus according to claim 3, wherein said reading out electrode on which the first voltage is imposed and said at least one of the transfer electrodes on which the second voltage is imposed are adjoining to same photo electric conversion element.

5. A driving method for solid-state imaging apparatus, comprising:
a semiconductor substrate defining a two-dimensional surface;
a multiplicity of photo electric conversion elements arranged in a plurality of rows and in a plurality of lines in a light receiving region of the semiconductor substrate;
a vertical electric charge transfer device having a plurality of vertical electric charge transfer channels arranged vertically between rows of the photo electric conversion elements and a plurality of transfer electrodes horizontally arranged over the vertical electric charge transfer channels;
reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction, and
the method is characterized by imposing a first voltage to the reading out electrode for reading out the accumulated signal electric charge from the photo electric conversion elements to the transfer channels in a reading out period and at a same time during the reading out period imposing a second voltage to at least one of the transfer electrodes adjoining to the reading out electrode for each photo electric conversion element for accumulating the signal electric charge in the vertical electric charge transfer channel under the one of the transfer electrode.

6. The solid-state imaging method according to claim 5, wherein said reading out electrode on which the first voltage is imposed and said at least one of the transfer electrodes on which the second voltage is imposed are adjoining to same photo electric conversion element.

7. The solid-state imaging method according to claim 5, wherein said first voltage and said second voltage are imposed at similar voltage.

8. The solid-state imaging apparatus according to claim 7, wherein said reading out electrode on which the first voltage is imposed and said at least one of the transfer electrodes on which the second voltage is imposed are adjoining to same photo electric conversion element.

* * * * *